(12) United States Patent
Chia et al.

(10) Patent No.: US 9,212,765 B1
(45) Date of Patent: Dec. 15, 2015

(54) MODULAR CABLE MANAGEMENT SYSTEM

(71) Applicant: Cisco Technology, Inc., San Jose, CA (US)

(72) Inventors: Vic Hong Chia, Sunnyvale, CA (US); Hong Tran Huynh, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 176 days.

(21) Appl. No.: 13/720,953

(22) Filed: Dec. 19, 2012

(51) Int. Cl.
*H02B 1/20* (2006.01)
*F16L 3/127* (2006.01)
*H02G 3/02* (2006.01)
*H05K 7/18* (2006.01)

(52) U.S. Cl.
CPC *F16L 3/127* (2013.01); *H02G 3/02* (2013.01); *H05K 7/18* (2013.01)

(58) Field of Classification Search
CPC ......... H04Q 1/062; H05K 7/1491; H01B 7/40
USPC ................. 174/100, 99 R; 361/826; 385/135
See application file for complete search history.

(56) References Cited

U.S. PATENT DOCUMENTS

| 6,118,075 | A  | * | 9/2000  | Baker et al. ................. | 174/72 A |
| 6,388,891 | B1 | * | 5/2002  | Falkenberg et al. .......... | 361/796  |
| 6,658,193 | B1 | * | 12/2003 | Ati et al. ...................... | 385/136  |
| 8,221,169 | B2 | * | 7/2012  | Ahmed ......................... | 439/719  |

\* cited by examiner

*Primary Examiner* — Hung S Bui
*Assistant Examiner* — James Wu

(57) ABSTRACT

A set of modular bracket units are mountable end-to-end in series on a support structure adjacent a cable interface area of an electronic equipment assembly, the form a composite cable management bracket. The bracket units are mountable in interchangeable positions in the series to define longitudinally extending series of segregated cable management openings through which cables are receivable for connection to respective electronic equipment ports, to restrain the cables against transverse escape from the respective cable management openings. The set of modular bracket units comprises at least one single-opening bracket unit that defines a single cable management opening, and at least one multi-opening bracket unit that defines, when mounted as part of the composite cable management bracket, two or more cable management openings. The bracket units that define different numbers of cable management openings are of equal modular length and has identical connection formations, to allow mounting of the bracket units in any desire sequence.

17 Claims, 7 Drawing Sheets

MODULAR CABLE MANAGEMENT SYSTEM

TECHNICAL FIELD

The present disclosure relates generally to electronic equipment and more particularly to methods and systems for management of cables in electronic equipment, and to components of such cable management systems.

BACKGROUND

Electronic equipment is often designed in accordance with standardized dimensional parameters, for example being shaped and dimensioned for reception in standard sized racks. Such racks typically include upright supports separated by an opening. The opening widths of racks tend to be standard sized, as adopted by industry, manufacturers, and/or governments. In the United States, for example, telephone companies may use racks having opening widths of 23 inches, whereas telephone companies in European countries may use racks having opening widths of 19 inches.

Rack mountable electronic equipment may take the form of modular electronic equipment. Often, modular electronic equipment is installed into a chassis and the chassis is then mounted in the opening of a rack. In the case of modular communication equipment, a chassis may house optical electronic equipment such as transmitters, receivers, intelligent control interface modules, power supplies, and the like. A chassis may also house cooling fans or other cooling mechanisms to aid in controlling the operating temperature of the equipment modules.

In a common scenario, an electronic equipment module slides into a slot (or slots) in the chassis and connects at one end to a chassis backplane defining a cable interface area that has mating communication connectors to receive the module. Cables may route to and through the chassis. Once the modules are installed into the slots they are typically wired to other electronic modules that may or may not be located in the same rack.

Cable management brackets are sometimes mounted on the chassis adjacent the cable interface area to route cables, e.g. in bundles, and/or to segregate cables connecting to different modules.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice and/or implement the disclosed systems, methods, and/or apparatuses. Other embodiments may incorporate structural, operational, and other changes. Portions and features of some embodiments may be included in, or substituted for, those of other embodiments.

Figure 1:
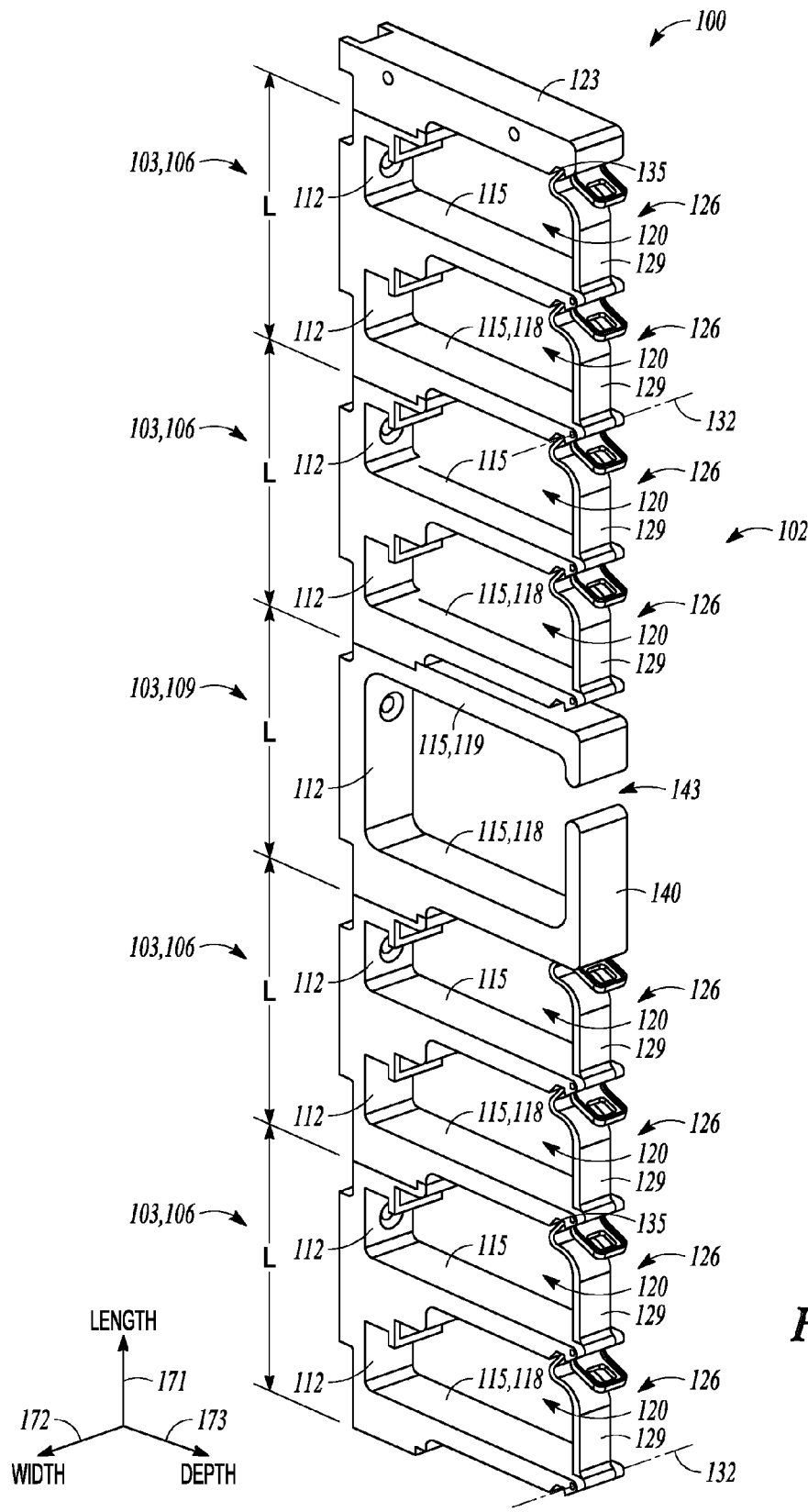
FIG. 1 is a schematic, three-dimensional front view, taken from above, of a set of bracket units to form a composite cable management bracket, when mounted, in accordance with an example embodiment.

In FIG. 1, numeral 100 generally indicates a set of bracket units 103 to form a composite cable management bracket 102 for electronic equipment, according to an example embodiment. The bracket unit set 100 is shown, for ease of illustration, FIGS. 1-5 in isolation, without being mounted on a support member such as a chassis of an electronic equipment module (see FIGS. 6 and 7). Note that the assembled bracket units 103 form a composite bracket 102 only when mounted on such a support structure, the isolated assembled bracket unit set 100 shown in FIGS. 1 and 3-5 is, for ease of description, referred to, inter alia, as the composite bracket 102.

The bracket unit set 100, in this example, comprises five bracket units 103, made up of four double-opening bracket units 106 and one single-opening bracket unit 109. As discussed in the description that follows, the bracket units 103 are shaped and dimensioned to provide modular components that can be mounted end-to-end in series (in relative spatial arrangement similar or analogous to that of FIG. 1), to form the composite cable management bracket 102 that provides a series of cable management openings 120 along its length. These cable management openings 120 serve to hold captive cables for different electronic equipment modules, segregating the cables to facilitate cable management by operators and supporting the weight of the cables to shield port connections of the cables to the electronic equipment modules from exposure to the cables' full weight.

Each of the bracket units 103 includes a base formation 112 that is elongate and, when the composite bracket 102 is assembled, are longitudinally aligned to provide a composite spine that runs along the length of the composite bracket 102. The base formation 112 defines mounting formations (discussed later with reference, e.g., to FIG. 3) for mounting the bracket unit 103 on the support structure such that the base formation 112 is anchored to and bears against the support structure.

Each of the double-opening bracket units 106 includes a pair of limbs or fingers 115 that project substantially perpendicularly away from the base formation 112, cantilever-fashion. The length of the fingers 115 determines a depth of the associated bracket unit 103. Because all the fingers 115 are of substantially equal length, the composite bracket 102 has a substantially constant depth dimension along its length.

Note that, for clarity of description, FIG. 1 shows a set of orthogonal axes that illustrate the directions associated with respective dimensions referred to in this description. Thus, a length 171 of the composite bracket 102 is defined by the composite spine formed by the aligned base formations 112, in the example of FIG. 1 being upright. A depth 173 of the composite bracket 102 is normal to the length of the composite bracket 102, in use projecting substantially perpendicularly away from a plane of a cable access opening (see FIGS. 6 and 7) next to which the composite bracket 102 may be mounted. In this example, the depth of the composite bracket 102 is determined by the distance by which the fingers 115 project away from the base formation 112.

Note that the two fingers 115 of each double-opening bracket unit 106 cannot, by themselves, define the two cable management openings 120 provided in practice by each double-opening bracket unit 106. See for example FIG. 5, which shows a double-opening bracket unit 106 in isolation. In this example, multi-opening bracket units such as the double-opening bracket unit 106 defines, when considered separately, one cable management opening 120 fewer than is provided at the double-opening bracket unit 106 when it is mounted as part of the composite bracket 102. In this example, each double-opening bracket unit 106 has a bottom end finger 118 at a lowermost end of the base formation 112, with an upper end of the base formation 112 having no limb or finger projecting therefrom.

Note that references to the upright orientation of the composite bracket 102 (and therefore labeling of elements as being upper-, lower-, top-, bottom elements, and the like) in these examples are for ease of description only, and are not to be understood restrictively. Indeed, the composite bracket 102 may, in other examples, have an orientation that is not upright, for example extending horizontally above or below a cable access opening.

Figure 2:
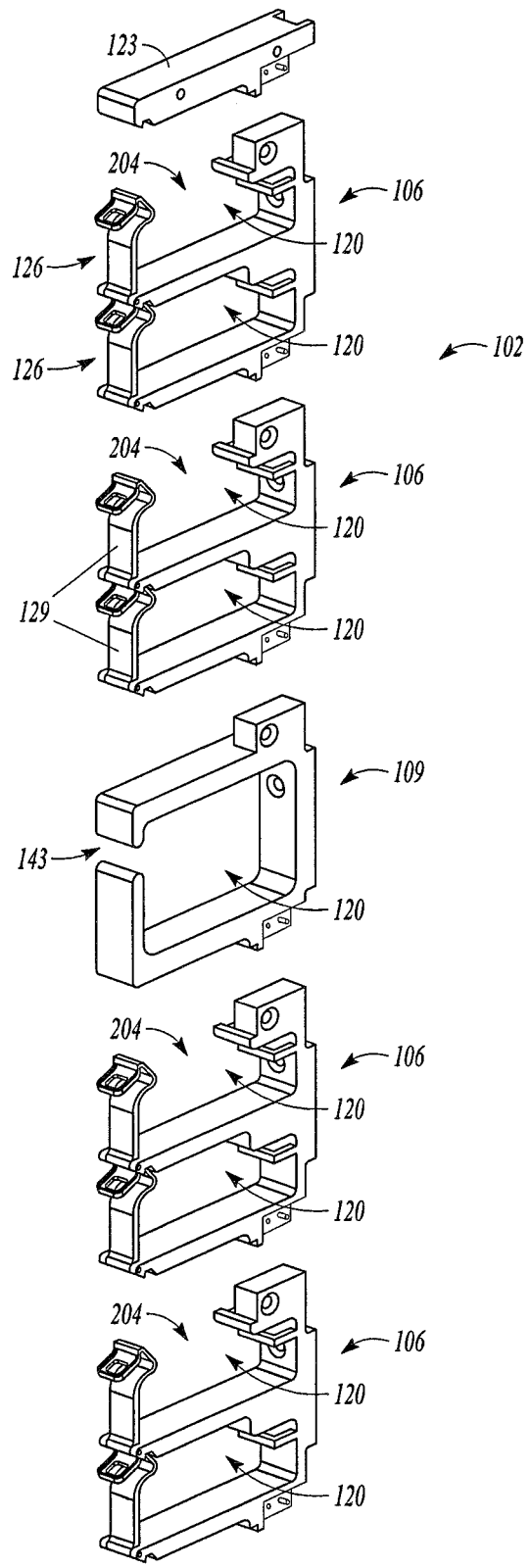
FIG. 2 is an exploded three-dimensional view of the set of bracket units of FIG. 1, in according to an example embodiment.

As can best be seen in FIG. 2, each double-opening bracket unit 106 defines an incomplete or partial cable management opening 120 at one of its ends in the lengthwise direction of the composite bracket 102, so that the cable management opening 120 has an operatively upper open side 204. The partial cable management openings 120 are, however, completed by the bottom end finger 118 of the immediately adjacent bracket unit 103, which occupies the open side 204, closing off the cable management opening 120. Each bottom end finger 118 (except the bottom end finger 118 of the bottommost bracket unit 103) thus borders and separates two adjacent cable management openings 120.

Although, as described, the cable management openings 120 thus defined by two bracket units 103 at their joint are not wholly bounded by elements of a single double-opening bracket unit 106, these cable management openings 120 are described as being provided by the double-opening bracket unit 106 that borders the greater portion of the cable management opening 120's circumference. Associated terms, such as "multi-opening bracket unit," "double-opening bracket unit," and the like, are to be understood accordingly. Thus, the example double-opening bracket unit 106 does not define, on its own, more than one cable management opening 120, but is nevertheless referred to as a "double-opening" or "multi-opening" bracket unit.

In this example, the bracket unit set 100 includes an end piece or end unit 123 that comprises a finger-like bar element to close off and complete (in this example) the uppermost cable management opening 120.

Distal ends of the fingers 115 of the double-opening bracket units 106 define between them respective gateway gaps 126 through which lateral passage of cables into and out of the associated cable management openings 120 can be effected. In this example, each gateway gap 126 is closed by a sprung latch 129 that is mounted for hinged displacement about a hinge axis 132 parallel to the width dimension of the composite bracket 102 and located at a distal end of that finger 115 which defines a base of the associated cable management opening 120. In this example, the latch 129 is manually movable to a closed position (shown in FIG. 1), in which an end of the latch 129 remote from the hinge axis 132 is in snap-latched engagement with a complementary latch recess 135 in the adjacent finger 115 or end unit 123, as the case may be. The latch 129 can be opened manually by hinged displacement after elastic deformation of the latch 129 to escape the latch recess 135, to allow insertion or removal into or from the cable management opening 120. When the latch 129 is closed, cables in the associated cable management opening 120 are held captive against lateral escape, by which is meant that a cable can only be removed from the cable management opening 120 by moving the cable through the cable management opening 120 in the cable's lengthwise direction. But the cable is obstructed from exiting the cable management opening 120 when the cable is moved sideways. In some embodiments, the latch 129 may be biased to its closed position by a spring arrangement.

There are, in this example embodiment, some differences between the double-opening bracket units 106 and the single-opening bracket unit 109. In particular, the single-opening bracket unit 109 has finger 115 at both its ends, in the example form of a bottom end finger 118 and a top end finger 119. The single cable management opening 120 defined by the single-opening bracket unit 109 is thus bordered in its entirety by parts of the single-opening bracket unit 109. Note also that the cable management opening 120 of the single-opening bracket unit 109 is larger than those of the bracket units 103, in this example being more or less twice the size of the other cable management openings 120.

The single-opening bracket unit 109 further has an unobstructed hole 143 defined between opposing ends of a prong 140 that projects in the lengthwise direction from the distal end of the bottom end finger 118, and a truncated lip 142 that projects towards the prong 140 from the distal end of the top end finger 119. Note that the cable management opening 120 of the single-opening bracket unit 109 is thus not completely enclosed, unobstructed lateral escape by a cable extending through the cable management opening 120 being possible through the hole 143. Nevertheless, the hole 143 is relatively small in size, allowing transverse passage therethrough of no more than one cable at a time, and is raised relative to a cable support surface provided by the bottom end finger 118. Inadvertent passage of cables through the cable management opening 120 of the single-opening bracket unit 109, while being possible, is hindered by the prong 140 and the lip 142, thus being restrained against lateral escape from the cable management opening 120.

The bracket units 103 are equal in length, having a common modular length (L) as shown in FIG. 1. The positions of the bracket units 103 in the series of modular units that together provide the composite bracket 102 are thus interchangeable. Consider, for example, that swapping positions of the single-opening bracket unit 109 and the bottommost double-opening bracket unit 106 in the arrangement of FIG. 6 does not necessitate any change in position or orientation of any of the other bracket units 103 in the composite bracket 102. Note that the end unit 123 is not considered to comprise a bracket unit 103 as used herein, and that it does not share the common modular length (L).

Modularity and interchangeability of the bracket unit set 100 is promoted by end formations 305, 306 that are common to all of the bracket units 103, so that each joint or engagement between neighboring bracket units 103 in the composite bracket 102 comprises a substantially identical engagement between a bottom end formation 305 of one bracket unit 103 and a top end formation 306 its immediately adjacent, neighboring top end formation 306. Each bracket unit 103 thus has an engagement formation (e.g., bottom end formation 305) at one end thereof, and a complementary engagement formation (e.g., top end formation 306) at its other end, to permit complementary mating engagement of each pair of adjacent bracket units 103 at their adjoining ends. Each of the bracket units 103 has a substantially identical bottom end formation 305, and each of the bracket units 103 has a substantially identical top end formation 306, so that any pair of bracket units 103 are compatible for end-to-end mounting on a support structure such as a chassis 607 of an electronic equipment assembly 600. Note that Such universal connection compatibility between the bracket units 103 of the set 100 promotes interchangeability of the bracket units 103, so that any permutation or combination of bracket unit sequence is an available and readily implementable option to a user, if a composite bracket 102 having a length equal to the cumulative length of the bracket units 103 in the set 100. As will be discussed later, the bracket units 103 may also be used to construct any desired composite bracket shorter than that shown in FIG. 1 by omitting one or more of the bracket units 103. Longer composite brackets 102 may likewise be built by adding one or more identical or compatible bracket units 103. This may beneficially permit re-use of the bracket units 103 in installations or applications different from that with which they were shipped.

Figure 3:
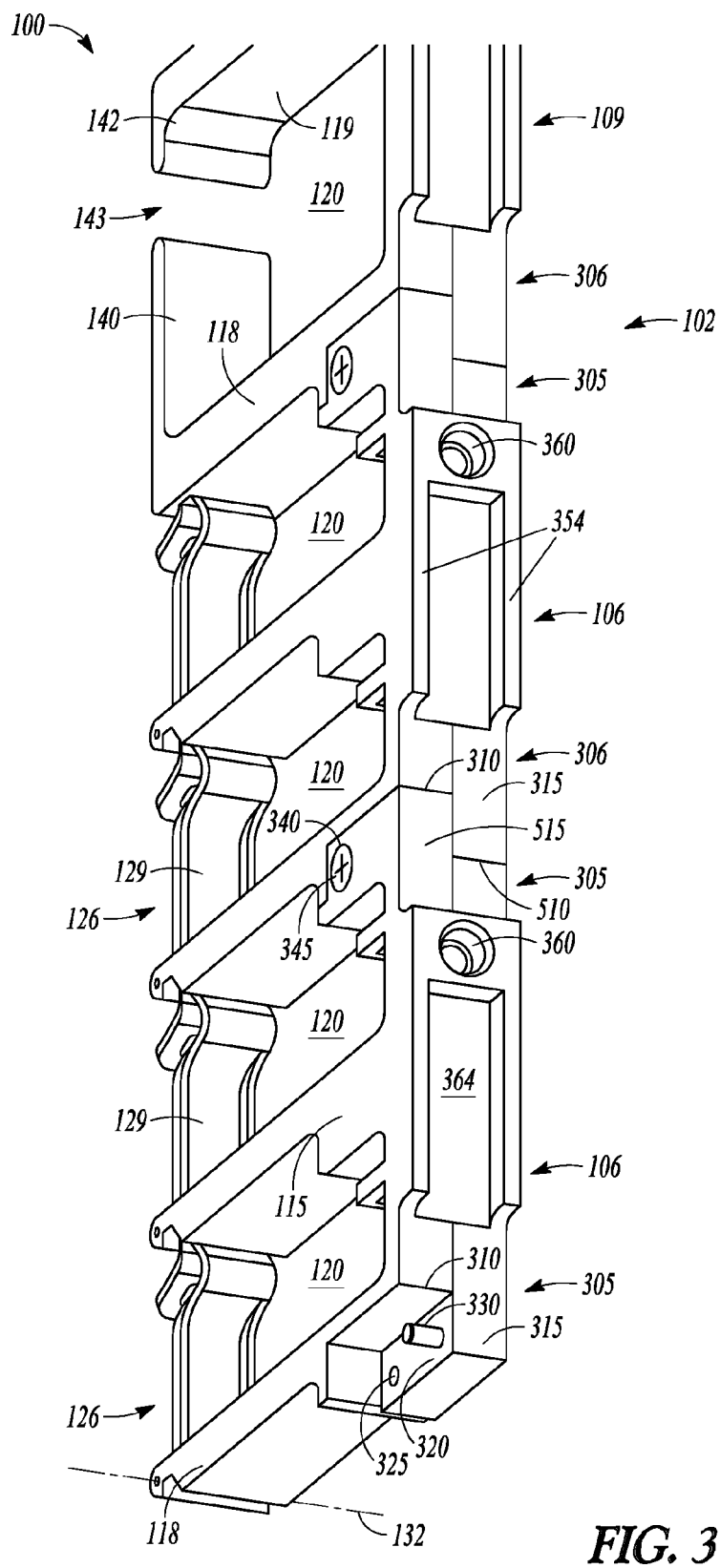
FIG. 3 is a three-dimensional rear view, taken from below, of a set of bracket units according to an example embodiment.

Selected features of the end formations 305, 306 according to this example embodiment are shown in FIG. 3. The bottom end formation 305 comprises a cavity in the form of a parallelepipedal niche 310 at a bottom end of the base formation 112 of the associated bracket unit 103. The bottom end formation 305 thus comprises a stepped formation comprising the niche 310 and a complementary step 315.

An laterally directed inner face of the step 315 provides a lateral engagement surface 320.

The top end formation 306 is shaped and dimensioned for complementary mating engagement with the bottom end formation 305 of a neighboring bracket unit 103. Thus, each top end formation 306 comprises a step 515 (see e.g., FIG. 5) complementary to the niche 310, and a niche 510 complementary to the step 315. The step 515 has a laterally inner face that defines a lateral engagement surface 520 that matches the lateral engagement surface 320 of the bottom end formation 305.

Figure 4:
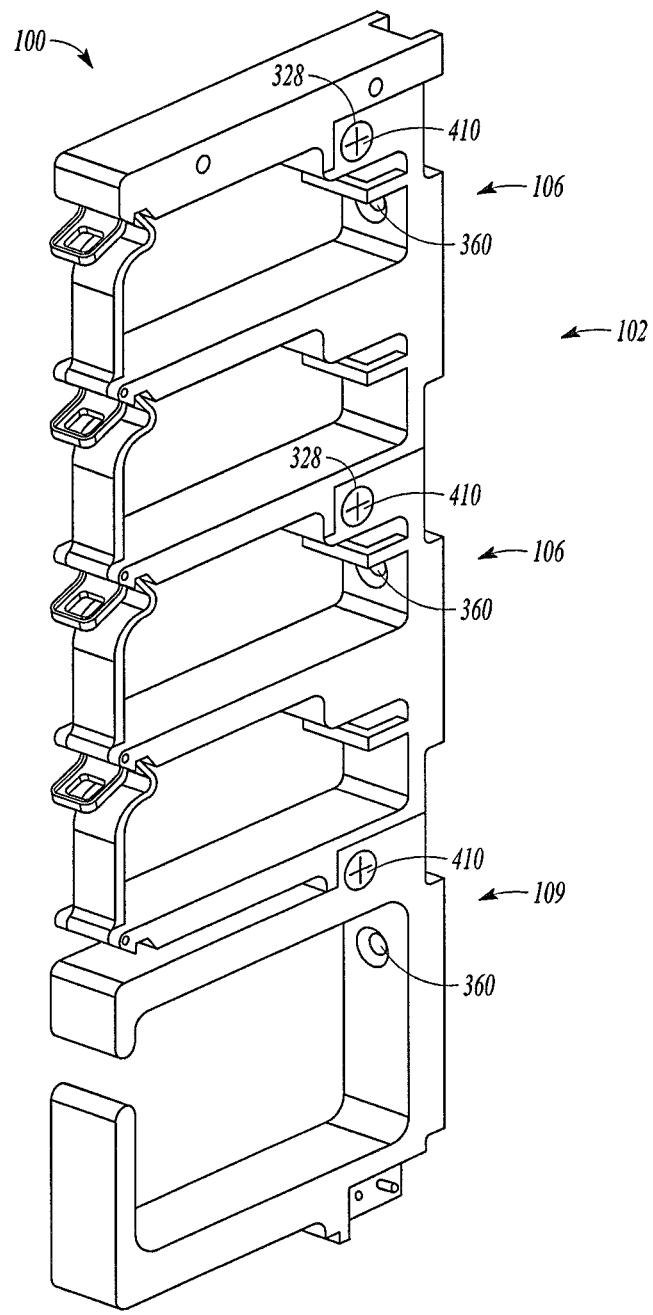
FIG. 4 is a three-dimensional front view, taken from above and from an opposite side to the view of FIG. 1, of a set of cable management bracket units according to an example embodiment.
Figure 5:
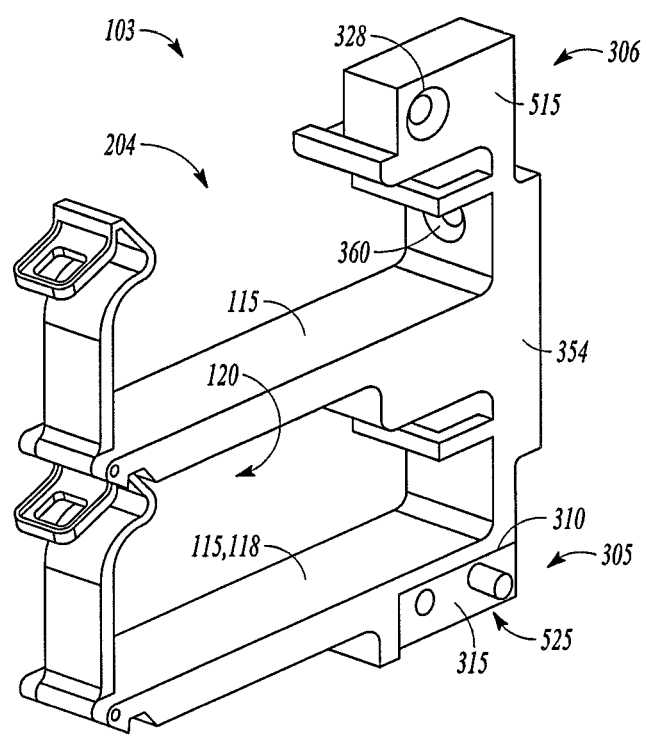
FIG. 5 is a three-dimensional view of a bracket unit to form part of a set of bracket units for forming a composite cable management bracket, when mounted on a support element associated with electronic equipment, according to an example embodiment.

A laterally extending blind threaded hole 325 open outs of the step 315, to receive a fastener in the example form of a screw 410 (FIG. 4). As can be seen in FIG. 3, the threaded hole 325 is located adjacent to an end of the niche 310 furthest from a rear edge face 364 of the bracket unit 103. A locating peg 330 projects perpendicularly from the lateral engagement surface 320.

The top end formation 306 provides to formations that are positioned and dimensioned for cooperation with the threaded hole 325 and the locating peg 330. First, the a pilot hole 614 extends laterally through the step 515, being positioned for alignment with the threaded hole 325 in a mating bottom end formation 305, and opening out of a laterally outer side face of the step 515 in a countersunk opening. The step 515 further defines a laterally extending locating socket 525 in its lateral engagement surface 520. A mouth of the locating socket 525 is positioned on the lateral engagement surface 520 in a location corresponding to that of the locating peg 330 on the lateral engagement surface 320 of the step 315.

These elements together comprise a fastening arrangement for connecting together the end formations 305, 306 at each joint that is formed between adjacent bracket units 103.

Each bracket unit 103 may further comprise a mounting formation to mount the bracket unit 103 on a support structure (e.g., the chassis 607). In this example, the mounting formation comprises a mounting hole 360 that extends transversely through the base formation 112 that provides a spine of the bracket unit 103, to permit passage of a threaded fastener such as a bolt or a screw through the mounting hole 360 and into engagement with the support structure on which the bracket unit 103 is mounted. In this example embodiment, the mounting hole 360 thus extends in the depthwise direction of the composite bracket 102.

Note that each of the example bracket units 103 has only a single mounting hole 360. In use, a bolt or screw may The mounting holes 360 are furthermore located at a consistent lengthwise position on the bracket units 103, so that a distance from the top end formation 306 along the length of the base formation 112 is identical for each of the bracket units 103, regardless of the number of cable management openings 120 that it provides.

Each mounting formation may further comprise a anchor member to anchor the bracket unit 103 to its support structure against pivoting about a shank of a fastener received in the mounting hole 360, in use. In this example embodiment, this function is served by a pair of ribs 354 that project from the rear edge face 364 and extend longitudinally along a portion of the side edges of the rear edge face 364. The ribs 354 define a slot 356 between them for receiving a complementary protrusion or formation on the support structure.

Figure 6:
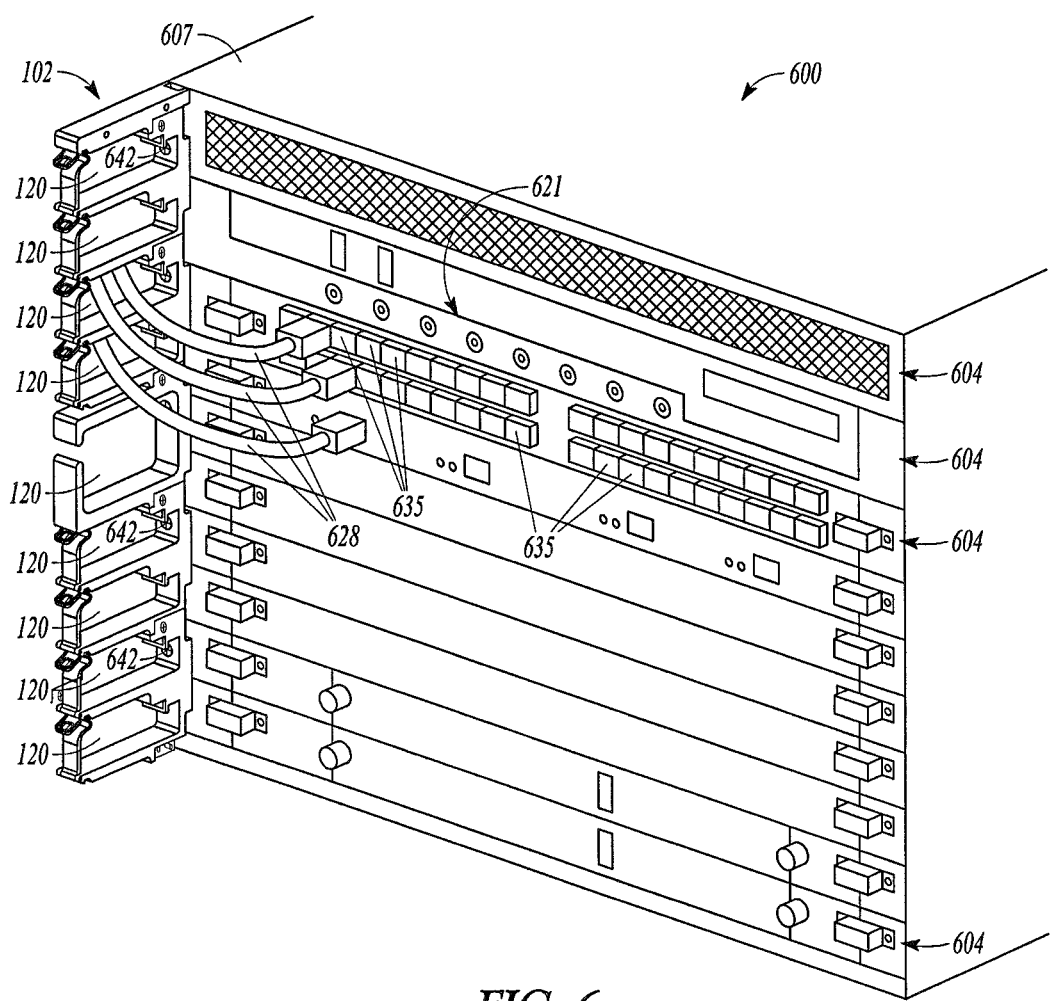
FIG. 6 is a three-dimensional schematic view of an electronic equipment system that comprises a composite cable management bracket mounted on a chassis of an electronic equipment module according to an example embodiment.

FIG. 6 shows one application of the example bracket unit set 100 in practice. The bracket unit set 100 may be employed to form a cable management bracket 102 for an electronic equipment assembly in the form of an electronic equipment assembly 600.

The composite bracket 102 may be mounted on a chassis 607 of the electronic equipment assembly 600 such that the composite bracket 102 extends lengthwise alongside a cable interface area 621 of the electronic equipment assembly 600, providing a longitudinally extending series of cable management openings 120 adjacent one edge of the cable interface area 621. In this example embodiment, the electronic equipment assembly 600 is defined by an operatively upright rectangular opening in the chassis 607. The opening is at the rear of the chassis 607 and provides cable access to connection ports of electrical components of the electronic equipment assembly 600.

In the example embodiment of FIG. 6, the composite bracket 102 is mounted on the chassis 607 to extend substantially vertically along a lateral side edge of the cable interface area 621. The lengthwise direction of the composite bracket 102 in the example embodiment of FIG. 6 is thus upright. When thus mounted, the composite bracket 102 extends continuously adjacent the cable interface area 621, so that there is no gap or omitted bracket units 103 in the series or row of bracket units 103 that together provide the composite bracket 102.

The composite bracket 102 thus provides a substantially continuous longitudinally extending series of cable management openings 120 that extends alongside the cable interface area 621. Cables 628 connected to respective connection ports 635 in the cable interface area 621 may be positioned to pass through one of the cable management openings 120, so that the cable 628 is held in position by the associated bracket unit 103, lateral escape of the cable 628 from the cable management opening 120 being restricted or prevented by the bracket unit 103. To insert a cable 628 into the cable management opening 120 of one of the double-opening bracket units 106, the cable 628 is latched to the double-opening bracket unit 106 by passing it laterally through the gateway gap 126. The latch 129 pivots open to allow entry of the cable 628 into the cable management opening 120, whereafter it is moved back into a latched position, trapping the cable 628 in the cable management opening 120. Instead, the cable 628 may be threaded through the cable management opening 120. For the single-opening bracket unit 109, the cable 628 may be passed laterally through hole 143.

The operator may arrange the cables 628 so that associated cables 628 extend through a common cable management opening 120. Often, the electronic equipment assembly 600 may comprise a number of stacked electronic equipment modules 604. Cables 628 connected to a particular electronic equipment module 604 may in such cases be segregated from other cables 628 by being held together, separate from the other cables 628 by a common bracket unit 103. In the example embodiment of FIG. 6, a single composite bracket 102 is mounted on the electronic equipment assembly 600 at a left edge of the cable interface area 621, but note that, in other embodiments, the cable interface area 621 may be flanked by two composite brackets 102. A composite bracket 102 may also in some cases be mounted to extend substantially horizontally.

To mount the bracket units 103 on the chassis 607, thereby to form the composite bracket 102, an operator may mount the bracket units 103 on the chassis 607 one-by-one in (or out of) sequence. Instead, the bracket units 103 may first be connected together to form the composite bracket 102 separate from the chassis 607, whereafter the composite bracket 102 may be mounted on the chassis 607.

In the former instance, each bracket unit 103 is mounted on the chassis 607 by, e.g., sliding the slot 356 (FIG. 3) downwards to receive a complementary protrusion provided by the chassis 607 or a support structure (such as a mounting bracket) connected thereto. Placement of the slot 356 over its corresponding mounting protrusion on the chassis 607 indexes the mounting hole 360 so that it is in register with a corresponding hole (e.g., a threaded socket) in the chassis 607. The operator may thereafter pass a fastener through the mounting hole 360 and into the registering support structure hole. Screwing the fastener tight then clamps the base formation 112 to the chassis 607.

Thereafter, a superjacent bracket unit 103 may be placed in position on the chassis 607 in similar fashion, with the bottom end formation 305 of the newly placed bracket unit 103 in mating engagement with the top end formation 306 of the first-mounted bracket unit 103. The step 315 of the superjacent bracket unit 103 may thus be received in the niche 510 of its subjacent neighbor, and vice versa for the step 515 and the niche 310 of the respective bracket units 103.

Such engagement may also comprise inserting the locating peg 330 of the superjacent bracket unit 103 into the complementary locating socket 525, thus indexing the end formations 305, 306 and bringing the threaded hole 325 into register with the corresponding pilot hole 328. The screw 410 is then passed through the pilot hole 328 into the threaded hole 325, whereafter the screw 410 is tightened to clamp the end formations 305, 306 together. In this interconnected condition, the lateral engagement surface 320 bears against the lateral engagement surface 520, so that lateral force interaction between the pair of bracket units 103 may be by operation of the screw 410 and by contact between the surfaces 320, 520.

This process may then be repeated for all of the bracket units 103, thus forming the composite bracket 102.

As mentioned, the bracket units 103 may instead first be connected together end-to-end by engagement of the end formations 305, 306 and fastening of the screws 410. Thereafter, the resultant composite bracket 102 may be positioned on the chassis 607 and may be attached with fasteners passed through the mounting holes 360.

Note that the example composite bracket 102 mounted on the chassis 607 is attached to the chassis 607 only by the fastener in the example form of a screw 642 passing through the mounting hole 360. The end-to-end connection of the bracket units 103, however, serve both to restrict relative lateral movement of the bracket units 103 at their joint (thus restraining pivotal displacement about the mounting hole 360), and to restrain relative movement of the bracket units 103 in the depthwise direction of the composite bracket 102, perpendicularly away from the chassis 607.

Module-specific cable segregation by the composite bracket 102 is facilitated by selection of the modular length (L) of the bracket units 103 such that it a multiple of (or is equal to) a standard unit height for electronic equipment modules. In this example embodiment, the modular length of the bracket units 103 is based on a rack unit (often referred to as U or RU), being a unit of measure used to describe the height of equipment intended for mounting in a 19-inch rack or a 23-inch rack One rack unit is 1.75 inches (44.45 mm) high. The size of a piece of rack-mounted equipment is frequently described as a number in "U". For example, one rack unit is often referred to as "1U" or "1RU," 2 rack units as "2U" or "2RU," and so on. The electronic equipment module 604 of the electronic equipment assembly 600 may comply with this convention, having respective heights measurable in integer RU values.

In this example, the modular length (L) of the bracket unit set 100 is 2RU. The single-opening bracket unit 109 can thus provide a single cable management opening 120 for a 2RU electronic equipment module 604, while the double-opening bracket units 106 can be used to provide respective cable management openings 120 for a pair of adjacent electronic equipment modules 604. Note that, in other embodiments, larger or smaller cable management openings may be provided instead, or in addition.

An operator can thus customize the positions of the respective bracket units 103 to correspond to the requirements or configuration of the particular electronic equipment assembly 600. Because of the bracket unit 103's universal modular length and identical complementary end formations 305, 306, the bracket units 103 can be arranged in any desired sequence.

Note that a particular bracket unit set 100 may be assembled for use with a corresponding electronic equipment assembly 600. A manufacturer or distributor may thus sell the electronic equipment assembly 600 together with the custom-selected bracket unit set 100. A benefit of the modularity of the bracket units 103, however, is that they may be used in combination with any hardware platform that has a support structure compatible with the mounting formations of the bracket units 103.

Figure 7:
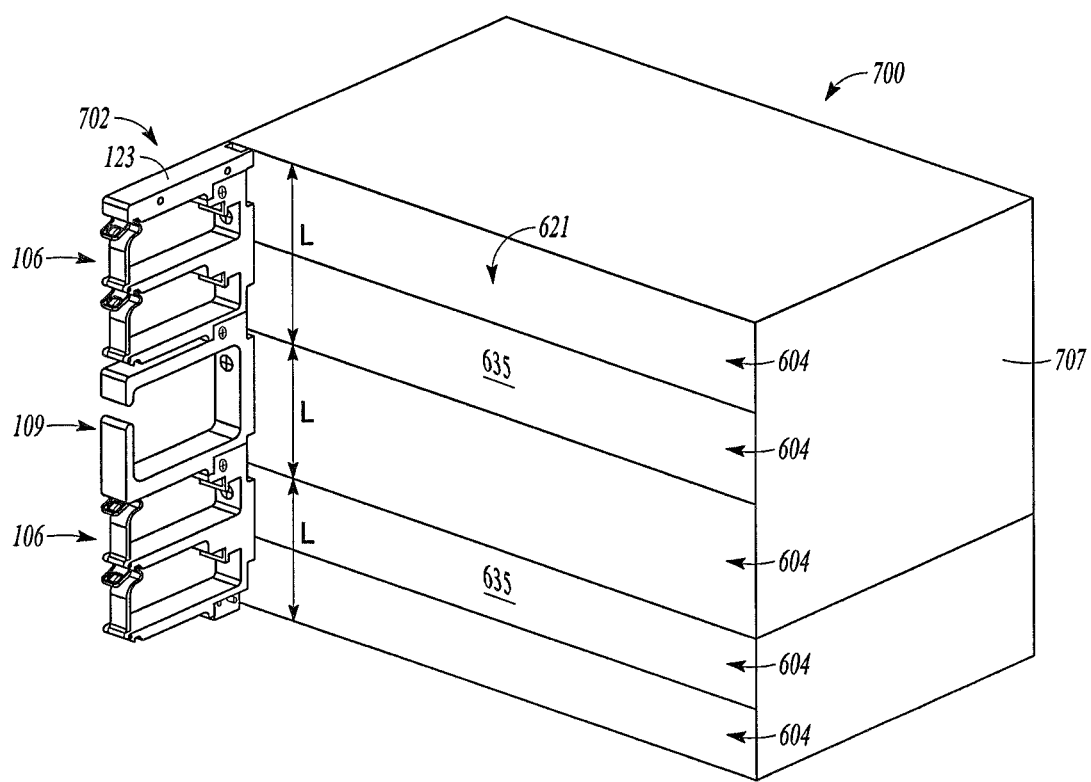
FIG. 7 is a three-dimensional schematic view corresponding to FIG. 6, showing bracket units of the composite cable management bracket being mounted on a different electronic equipment module and in a different arrangement.

FIG. 7 shows an electronic equipment assembly 600 in accordance with another example embodiment. The electronic equipment assembly 700 is largely similar to the electronic equipment assembly 600 of FIG. 6, but has a different arrangement of electronic equipment modules 604. A user may customize the bracket unit set 100 (sold and shipped for use with the electronic equipment assembly 600) to satisfy with the requirements of the electronic equipment assembly 700. The example embodiment of FIG. 6 shows a different composite bracket 702 made up of two double-opening bracket units 106, one single-opening bracket unit 109, and the end unit 123. The type and positioning of the bracket units 103 in the composite cable management bracket 702 is thus selected by the operator to correspond to a chassis 707 and the particular electronic equipment modules 604 of the electronic equipment assembly 700.

A maker or distributor of electronic equipment may make and sell a range of electronic equipment assemblies, storage equipment (such as server racks), and systems with a common modular standard compatible with the mounting formations of the bracket units 103. Instead of having to manufacture custom-made brackets for each unique system or equipment arrangement, the manufacturer or distributor may provide modular bracket units 103 for use with all of the equipment in the range of products, by merely selecting the number and type of bracket units 103 that correspond to the respective applications.

A benefit of such broad usability of the modular bracket units 103 is related to economies of scale. Because of the rigidity and strength requirements of cable management brackets, they are often metal parts. To avoid the substantial cost of tooling and manufacturing (e.g., making custom die molds for each unique product's cable management brackets) polymeric plastics brackets have sometimes been employed. These plastics brackets have, in practice, often proven to be prone to failure or premature wear.

For construction of the bracket units 103 as described herein, however, cost considerations associated with cast metal parts are ameliorated by a substantial increase in the number of products in the product range that is serviced by identical bracket units 103. It is expected, for example, that the double-opening bracket units 106 would form part of respective bracket unit sets of many different products in the range of modularly compatible products. The volume of bracket units produced is thus expected to make the manufacturing and distribution of bracket units 103 that are of cast iron or cast steel economically feasible, if not beneficial, in comparison to, for example, injection molded plastics brackets.

Note also that other, specialized bracket units may be provided for unique applications. Although the cable-management features of such speciality bracket units are not described herein, their modular length (L) and end formations 305, 306 may be identical to those of the described bracket units 103, to allow for modular compatibility.

Yet a further benefit of the described example embodiments is that an end user is not limited in the use of the bracket units 103, as is the case with customized brackets for each unique system. The bracket units 103 can thus be re-used, or bracket units 103 from different original sets can be mixed and matched ad-hoc to meet user needs.

Note further that all of the bracket units 103 have the same depth (due in this example to consistent finger 115 length), so that the bracket units 103 have a consistent form factor (also having the same length (L)). This dimensional consistency promotes free mixing and matching between different sets, while maintaining a unified aesthetic appearance.

Note that the bracket unit set 100 may, in other embodiments, be mounted on support structures other than the chassis 607. For example, the bracket units 103 may be mounted on a support post forming part of a server rack, thus forming part of a rack installation in which electronic equipment modules can be held in a stacked arrangement.

Although embodiments have been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A composite cable management bracket formed from a set of modular bracket units comprising:
   one or more single-opening bracket units that respectively define, when mounted as part of the composite cable management bracket, a single cable management opening, wherein each of the one or more single-opening bracket units comprises a top end stepped formation and a bottom end stepped formation; and
   one or more multi-opening bracket units that include a pair of fingers projecting substantially perpendicularly away from a base formation to define, when mounted as part of the composite cable management bracket, two or more cable management openings, the one or more multi-opening bracket units further including at least one latch with a first end hingedly coupled to a distal end of at least one of the fingers and a second end that, when the latch is in a closed position, is in engagement with a finger of another bracket unit coupled to the one or more multi-opening bracket units, and wherein each of the one or more multi-opening bracket units comprises a top end formation and a bottom stepped end formation,
   wherein the bottom end stepped formations of the single-opening bracket units and the bottom end stepped formations of the multi-opening bracket units are substantially identical and comprise a niche and an associated step that define a define a first inner face,
   wherein the top end stepped formations of the single-opening bracket units and the top end stepped formations of the multi-opening bracket units are substantially identical and comprise a niche and an associated step that define a second inner face,
   wherein the niche of the top end stepped formations is complementary to the associated step in the bottom end stepped formations and the associated step of the top end stepped formations is complementary to the niches in the bottom end stepped formations enabling any pair of the single-opening bracket units and the multi-opening bracket units to be mountable end-to-end in series in interchangeable positions where the first inner face of the bottom end stepped formation is engaged with the second inner face of the top end stepped formation, and when any pair of the single-opening bracket units and the multi-opening bracket units are mounted end-to-end, a longitudinally extending series of segregated cable management openings is defined.

2. The composite cable management bracket of claim 1, wherein the single-opening bracket units and the multi-opening bracket units in the set of modular bracket units have a common modular length.

3. The composite cable management bracket of claim 2, wherein the common modular length is a whole number multiple of one rack unit (RU).

4. The composite cable management bracket of claim 3, wherein the common modular length is 2 RU.

5. The composite cable management bracket of claim 1, wherein the single-opening bracket units and the multi-opening bracket units are shaped and dimensioned such that the composite cable management bracket has a substantially constant depth dimension transverse to a cable interface area.

6. The composite cable management bracket of claim 1, wherein the latch is a spring-latch mounted for hinged displacement about a hinge axis on the distal end of the pair of fingers.

7. The composite cable management bracket of claim 1, wherein each of the single-opening bracket units and each of the multi-opening bracket units includes a mounting formation to effect mounting of the composite cable management bracket on a support structure.

8. The composite cable management bracket of claim 7, wherein the mounting formations comprise a mounting hole to receive a fastener, and wherein the mounting holes are located at a consistent position along a length dimension of each of the single-opening bracket units and of each of the multi-opening bracket units so that the composite cable management bracket defines a series of mounting holes spaced at a constant interval equal to a modular length common to each of set of modular bracket units.

9. A method comprising:
 obtaining one or more single-opening bracket units that respectively define a single cable management opening, wherein each of the one or more single-opening bracket units comprises a top end stepped formation and a bottom end stepped formation;
 obtaining one or more multi-opening bracket units that include a pair of fingers projecting substantially perpendicularly away from a base formation to respectively define two or more cable management openings, the one or more multi-opening bracket units further including at least one latch with a first end hingedly coupled to a distal end of at least one of the fingers and a second end, and wherein each of the one or more multi-opening bracket units comprises a top end formation and a bottom end stepped formation,
 wherein the bottom end stepped formations of the single-opening bracket units and the bottom end stepped formations of the multi-opening bracket units are substantially identical and comprise a niche, an associated step, and a first inner surface, wherein the top end stepped formations of the single-opening bracket units and the top end stepped formations of the multi-opening bracket units are substantially identical and comprise a niche, an associated step, and a second inner surface, where the niche of the top end stepped formations is complementary to the steps in the bottom end stepped formations and the associated step of the top end formations is complementary to the niches in the bottom end stepped formations;
 connecting together opposing top and bottom end stepped formations of a number of the single-opening bracket units and the multi-opening bracket units end-to-end in series in interchangeable positions so that the first inner surface of the bottom end stepped formations engages the second inner surface of the top end stepped formations to form a composite cable management bracket that defines a longitudinally extending series of segregated cable management openings, and wherein the second end of the at least one latch of the one or more multi-opening bracket units is in engagement with a finger of another bracket unit when the at least one latch is in a closed position; and
 mounting the composite cable management bracket on a support structure adjacent a cable interface area of an electronic equipment assembly such that the segregated cable management openings are configured to receive cables for connection to respective ports at the cable interface area while being restrained by the composite cable management bracket against transverse escape from the respective cable management openings.

10. The method of claim 9, wherein the single-opening bracket units and the multi-opening bracket units have a common modular length.

11. The method of claim 10, wherein the common modular length is a whole number multiple of a rack unit (RU).

12. The method of claim 9, wherein the latch is a spring-latch mounted for hinged displacement about a hinge axis on the distal end of the pair of fingers.

13. The method of claim 9, further comprising:
 passing a fastener through aligned openings in the cable management bracket, the fastener extending in a direction transverse to both a length dimension and a depth dimension of the composite cable management bracket.

14. The method of claim 9, wherein the support structure forms part of a chassis of the electronic equipment assembly.

15. A system comprising:
 an electronic equipment assembly that has a cable interface area comprising multiple connection ports connectable to respective cables;
 a composite cable management bracket mounted on the electronic equipment assembly to extend lengthwise alongside the cable interface area, comprising:
  one or more single-opening bracket units that respectively define a single cable management opening, wherein each of the one or more single-opening bracket units comprises a top end stepped formation and a bottom end stepped formation; and
  one or more multi-opening bracket units that include a pair of fingers projecting substantially perpendicularly away from a base formation to define, when mounted as part of the composite cable management bracket, two or more cable management openings, the multi-opening bracket units further including at least one latch with a first end hingedly coupled to a distal end of at least one of the fingers and a second end that, when in a closed position, is in engagement with a finger of another bracket unit coupled to the one or more multi-opening bracket units, and wherein each of the one or more multi-opening bracket units comprises a top end formation and a bottom end stepped formation,
 wherein the bottom end stepped formations of the single-opening bracket units and the bottom end stepped formations of the multi-opening bracket units are substantially identical and comprise a niche and an associated step that define a first inner surface,
 wherein the top end stepped formations of the single-opening bracket units and the top end stepped formations of the multi-opening bracket units are substantially identical and comprise a niche and an associated step that define a second inner surface,
 wherein the niche of the top end stepped formations is complementary to the steps in the bottom end stepped formations and the associated step of the top end stepped formations is complementary to the niches in the bottom end stepped formations enabling any pair of the single-opening bracket units and the multi-opening bracket units to be mountable end- to-end in series in interchangeable positions where the first inner surface of the bottom end stepped formations engages the second inner surface of the top end stepped formations, and when any pair of the single-opening bracket units and the multi-opening bracket units are mounted end-to-end, a longitudinally extending series of segregated cable management openings is defined.

16. The system of claim 15, wherein each of the single-opening bracket units and each of the multi-opening bracket units is attached to the electronic equipment assembly by a single fastener extending through a mounting hole in the respective bracket unit, the mounting holes being positioned on the respective bracket units such that the composite cable management bracket is attached to the electronic equipment assembly by multiple fasteners spaced along the length of the composite cable management bracket at a regular spacing.

17. The system of claim 15, wherein the latch is a spring-latch mounted for hinged displacement about a hinge axis disposed on the distal end of the pair of fingers.

* * * * *

UNITED STATES PATENT AND TRADEMARK OFFICE
CERTIFICATE OF CORRECTION

| | | |
|---|---|---|
| PATENT NO. | : 9,212,765 B1 | Page 1 of 1 |
| APPLICATION NO. | : 13/720953 | |
| DATED | : December 15, 2015 | |
| INVENTOR(S) | : Vic Hong Chia et al. | |

It is certified that error appears in the above-identified patent and that said Letters Patent is hereby corrected as shown below:

IN THE CLAIMS

In Col. 11, line 45, add "and" after "second inner surface,".

Signed and Sealed this
Twelfth Day of April, 2016

Michelle K. Lee
*Director of the United States Patent and Trademark Office*